US007608544B2

(12) United States Patent
Harada

(10) Patent No.: US 7,608,544 B2
(45) Date of Patent: Oct. 27, 2009

(54) ETCHING METHOD AND STORAGE MEDIUM

(75) Inventor: Akitoshi Harada, Hillsboro, OR (US)

(73) Assignee: Tokyo Electron Limited, Tokyo (JP)

( * ) Notice: Subject to any disclaimer, the term of this patent is extended or adjusted under 35 U.S.C. 154(b) by 136 days.

(21) Appl. No.: 11/753,228

(22) Filed: May 24, 2007

(65) Prior Publication Data
US 2007/0275564 A1 Nov. 29, 2007

Related U.S. Application Data

(60) Provisional application No. 60/811,442, filed on Jun. 7, 2006.

(30) Foreign Application Priority Data
May 25, 2006 (JP) ............................. 2006-145849

(51) Int. Cl.
*H01L 21/311* (2006.01)
(52) U.S. Cl. .......... 438/695; 204/192.25; 257/E21.024; 257/E21.033; 438/729; 216/37
(58) Field of Classification Search ................ 438/731, 438/729, 695; 204/192.1, 192.23, 192.25; 257/E21.024, E21.026, E21.033, E21.035, 257/E21.038, E21.039; 216/37, 51
See application file for complete search history.

(56) References Cited

U.S. PATENT DOCUMENTS

| 6,124,208 | A | * | 9/2000 | Park et al. | .................... 438/696 |
| 6,811,956 | B1 | * | 11/2004 | Gabriel | ........................ 430/313 |
| 2003/0219683 | A1 | * | 11/2003 | Nagarajan et al. | ........... 430/296 |
| 2009/0020417 | A1 | * | 1/2009 | Kim et al. | .............. 204/192.25 |

FOREIGN PATENT DOCUMENTS

JP 3-174724 7/1991

* cited by examiner

*Primary Examiner*—Caridad M Everhart
(74) *Attorney, Agent, or Firm*—Oblon, Spivak, McClelland, Maier & Neustadt, L.L.P.

(57) ABSTRACT

An etching method which makes it possible to obtain a desired etching shape with ease, and a computer-readable storage medium storing a program for implementing the method. The etching method is executed by a substrate processing apparatus that performs plasma processing on a semiconductor wafer by plasma. The apparatus comprises a substrate accommodating chamber for accommodating the semiconductor wafer which has an oxide film and a resist film formed on the oxide film, and an upper electrode plate disposed in the substrate accommodating chamber and exposed in a processing space in the substrate accommodating chamber. At least part of the upper electrode plate is formed of a silicon-containing material. The upper electrode plate is sputtered by plasma, and the oxide film is etched by plasma.

11 Claims, 3 Drawing Sheets

ETCHING METHOD AND STORAGE MEDIUM

BACKGROUND OF THE INVENTION

1. Field of the Invention

The present invention relates to an etching method and a storage medium, and more particularly to an etching method for etching an oxide film using plasma, with a resist film as a mask.

2. Description of the Related Art

To etch a film, such as an $SiO_2$ oxide film, formed to be etched on a wafer for a semiconductor device by plasma according to a predetermined pattern, a substrate processing apparatus makes use of a resist film formed on the oxide film according to the predetermined pattern, as a mask. The resist film has openings for exposing portions of the oxide film at respective locations where via-holes or the like are required to be formed. Plasma enters through the openings to the respective exposed portions of the oxide film to etch the same. It should be noted that the resist film is formed of a photosensitive resin.

In the case of etching the oxide film by plasma generated from a CF-based gas, it is difficult to secure a selection ratio of the oxide film to the resist film due to low resistance of the resist film to the CF-based gas plasma. As a result, in the etching of the oxide film, the resist film can be etched together with the oxide film, which causes deformation of the openings of the resist film. At this time, via-holes formed by the etching are deformed due to the deformation of the openings of the resist film. More specifically, the shapes of the formed via-holes are sometimes not circular in horizontal cross section, and the diameter of the via-holes is sometimes larger than a desired value. In short, it is difficult to obtain a desired etching shape.

To solve this problem, a method of enhancing the resistance of a resist film to plasma has conventionally been developed. For example, a method is known in which a silicon (Si) element is doped into a resist film by a beam prior to etching of an oxide film (see e.g. Japanese Laid-Open Patent Publication (Kokai) No. H03-174724).

However, in the method disclosed in Japanese Laid-Open Patent Publication (Kokai) No. H03-174724, it is required to dope the silicon element into a resist film by a beam, which makes it necessary to add a special device such as a beam irradiation device to a substrate processing apparatus or provide the special device separately from the substrate processing apparatus. Therefore, the improvement of the strength of a resist film cannot be attained easily and conveniently, which makes it difficult to obtain a desired etching shape.

SUMMARY OF THE INVENTION

The present invention provides an etching method which makes it possible to obtain a desired etching shape with ease, and a computer-readable storage medium storing a program for implementing the method.

A first aspect of the present invention provides an etching method which is executed by a substrate processing apparatus that includes an accommodating chamber for accommodating a substrate having an oxide film and a resist film formed on the oxide film, and an exposed member disposed in the accommodating chamber and exposed to a space in the accommodating chamber, and performs plasma processing on the substrate by plasma generated in the accommodating chamber, at least part of the exposed member being formed of a silicon-containing material, the etching method comprising a sputtering step of sputtering the exposed member by plasma, and an oxide film etching step of etching the oxide film by plasma.

According to the first aspect of the present invention, the exposed member at least part of which is formed of a silicon-containing material is sputtered by plasma, and the oxide film is etched by plasma. When the exposed member is sputtered, a silicon element is released from the exposed member, and the released silicon element is deposited on the resist film of the substrate to form the silicon-containing material. The silicon-containing material is resistant to the plasma for etching the oxide film. Therefore, the strength of the resist film can be easily improved, which makes it possible to obtain a desired etching shape with ease.

In the first aspect of the present invention, the substrate can have an antireflection film formed between the oxide film and the resist film, and the etching method can comprise an antireflection film etching step of etching the antireflection film prior to the sputtering step.

According to the first aspect of the present invention, the antireflection film formed between the oxide film and the resist film is etched prior to the sputtering step. In the etching of the antireflection film, the resist film is also etched, and hence the thickness of the resist film is reduced. However, by sputtering the exposed member, it is possible to form the silicon-containing film on the resist film having the reduced thickness, thereby preventing the resist film from being removed when the oxide film is etched. This makes to possible to positively etch the oxide film to a desired etching shape.

In the first aspect of the present invention, a high-frequency power can be supplied to the exposed member.

According to the first aspect of the present invention, since the high-frequency power is supplied to the exposed member, plasma can be efficiently drawn into the exposed member, which makes it possible to improve the efficiency of sputtering of the exposed member. As a consequence, it is possible to quickly form the silicon-containing film on the resist film of the substrate.

In the first aspect of the present invention, in the sputtering step, plasma generated from an inert gas or an inactive gas can be used.

According to the first aspect of the present invention, since the plasma generated from an inert gas or an inactive gas is used in the sputtering step, it is possible to sputter the exposed member without degrading the resist film or the oxide film of the substrate.

In the first aspect of the present invention, the substrate processing apparatus can include a mounting stage disposed in the accommodating chamber, for having the substrate placed thereon, and the exposed member can be an electrode plate disposed in facing relation to the mounting stage.

According to the first aspect of the present invention, since the electrode plate sputtered is disposed in facing relation to the mounting stage on which the substrate is placed, the silicon element released from the electrode plate can be positively deposited on the resist film of the substrate, which makes it possible to positively form the silicon-containing film.

In the first aspect of the present invention, a high-frequency power can be supplied to the mounting stage, and the high-frequency power supplied to the electrode plate can be larger than the high-frequency power supplied to the mounting stage.

According to the first aspect of the present invention, since the high-frequency power supplied to the electrode plate is larger than the high-frequency power supplied to the mounting stage, it is possible to cause the electrode plate to be sputtered in a larger amount by plasma than the mounting stage is sputtered by plasma, whereby the amount of the silicon element released from the electrode plate can be increased. As a consequence, the silicon-containing film can be positively formed on the resist film of the substrate.

A second aspect of the present invention provides a computer-readable storage medium storing a program for implementing an etching method which is executed by a substrate processing apparatus that includes an accommodating chamber for accommodating a substrate having an oxide film and a resist film formed on the oxide film, and an exposed member disposed in the accommodating chamber and exposed to a space in the accommodating chamber, and performs plasma processing on the substrate by plasma generated in the accommodating chamber, at least part of the exposed member being formed of a silicon-containing material, the etching method comprising a sputtering step of sputtering the exposed member by plasma, and an oxide film etching step of etching the oxide film by plasma.

According to the second aspect of the present invention, the same or similar advantages attained by the etching method according to the first aspect can be achieved.

Other features and advantages of the present invention will be apparent from the following description taken in conjunction with the accompanying drawings, in which like reference characters designate the same or similar parts throughout the figures thereof.

DETAILED DESCRIPTION OF THE PREFERRED EMBODIMENTS

A preferred embodiment of the present invention will be described in detail below with reference to the drawings.

First, a description will be given of a substrate processing apparatus that executes an etching method according to the embodiment.

Figure 1:
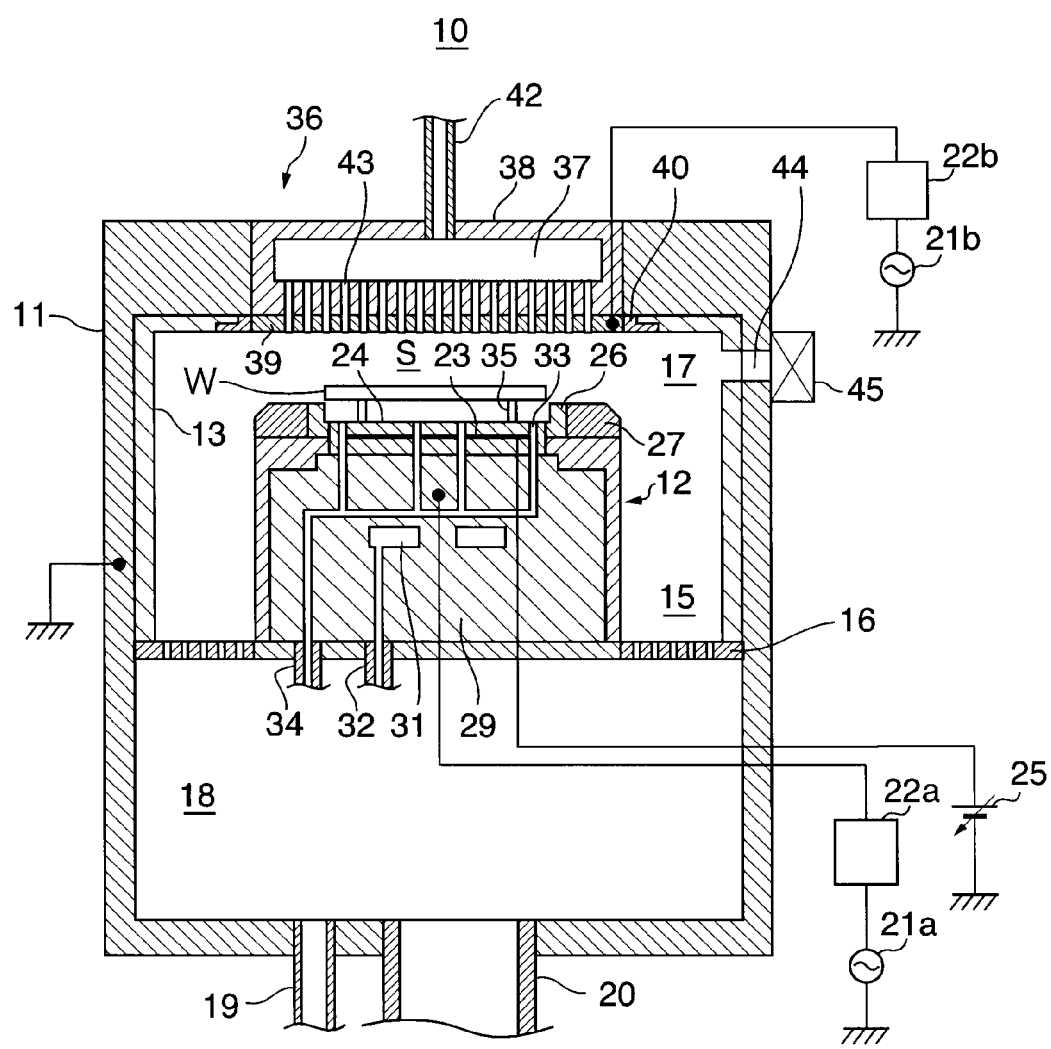
FIG. 1 is a schematic cross-sectional view of a substrate processing apparatus that executes an etching method according to an embodiment of the present invention.

FIG. 1 is a schematic cross-sectional view of the substrate processing apparatus that executes the etching method according to the embodiment.

Referring to FIG. 1, the substrate processing apparatus 10 has a substrate accommodating chamber 11 having a hollow cylindrical body, and the body of the substrate accommodating chamber 11 has a processing space S (space in the accommodating chamber) formed therein. Further, disposed in the substrate accommodating chamber 11 is a cylindrical susceptor 12 as a mounting table on which is placed a semiconductor wafer W (hereinafter simply referred to as "the wafer W") having a diameter of e.g. 300 mm. The substrate accommodating chamber 11 has an inner wall surface covered with a side wall member 13. The side wall member 13 is formed of aluminum, and a surface thereof facing the processing space S is coated with yttria ($Y_2O_3$). The susceptor 12 has a conductive part 29 formed of a conductive material, such as aluminum.

In the substrate processing apparatus 10, the inner side wall of the substrate accommodating chamber 11 and a side surface of the susceptor 12 define therebetween an exhaust passage 15 functioning as a flow path for discharging gas molecules above the susceptor 12 out of the substrate accommodating chamber 11. An exhaust plate 16 is disposed in an intermediate portion of the exhaust passage 15.

The exhaust plate 16 is formed by a plate member formed with numerous holes, and functions as a partition plate for dividing the interior of the substrate accommodating chamber 11 into an upper part and a lower part. Plasma, described hereinafter, is generated in the upper one (hereinafter referred to as "the reaction chamber") 17 of the parts into which the substrate accommodating chamber 11 is partitioned by the exhaust plate 16. A rough evacuation pipe 19 and a main evacuation pipe 20 open in the lower part (hereinafter referred to as "the manifold") 18 of the substrate accommodating chamber 11. A DP (Dry Pump), not shown, is connected to the rough evacuation pipe 19, and a TMP (Turbo Molecular Pump), not shown, is connected to the main evacuation pipe 20. The exhaust plate 16 catches or reflects ions and radicals generated in the processing space S to thereby prevent leakage of these into the manifold 18.

Through the rough evacuation pipe 19 and the main evacuation pipe 20, gas in the reaction chamber 17 is discharged out of the substrate accommodating chamber 11 via the manifold 18. More specifically, through the rough evacuation pipe 19, the interior of the substrate accommodating chamber 11 is decompressed from atmospheric pressure to a low vacuum state, while the main evacuation pipe 20 is cooperatively used with the rough evacuation pipe 19 to decompress the interior of the substrate accommodating chamber 11 from atmospheric pressure to a high vacuum state (e.g. 133 Pa (1 Torr) or lower) lower than the low vacuum state.

A high-frequency power supply 21a is connected to the conductive part 29 of the susceptor 12 via a matcher 22a to supply a high-frequency power to the conductive part 29. As a consequence, the conductive part 29 of the susceptor 12 functions as a high-frequency electrode. The matcher 22a reduces reflection of the high-frequency power from the conductive part 29 to maximize the efficiency in supply of the high-frequency power to the conductive part 29. The susceptor 12 applies to the processing space S the high-frequency power supplied from the high-frequency power supply 21a.

Disposed above the susceptor 12 is a disk-shaped electrostatic chuck 24 having an electrode plate 23 therein. The wafer W is placed on the susceptor 12 via the electrostatic chuck 24. A DC power supply 25 is electrically connected to the electrode plate 23. When a negative DC voltage is applied to the electrode plate 23, a positive potential is generated on a rear surface of the wafer W, and therefore a potential difference is created between the electrode plate 23 and the rear surface of the wafer W. As a result, the wafer W is held on the upper surface of the electrostatic chuck 24 by attraction by a Coulomb force or a Johnsen-Rahbek force generated by the potential difference.

Further, an annular focus ring 26 is provided above the susceptor 12 in a manner enclosing the wafer W attractedly held on the upper surface of the susceptor 12. The annular focus ring 26, which is formed of silicon or silica ($SiO_2$), is exposed to the processing space S to converge plasma in the processing space S toward a front surface of the wafer W to thereby enhance the efficiency of plasma processing, such as RIE (Reactive Ion Etching) processing. The high-frequency power supplied to the conductive part 29 is transmitted to the focus ring 26 via the electrostatic chuck 24. At this time, the focus ring 26 applies the high-frequency power to the processing space S. Therefore, the focus ring 26 also functions as a high-frequency electrode. Further, an annular cover ring 27 formed of quartz is fitted around the focus ring 26 so as to protect the side surface of the focus ring 26.

Inside the susceptor 12 is formed an annular coolant chamber 31 extending e.g. along the circumference of the susceptor 12. A coolant, such as cooling water or a Galden (registered trademark) fluid, at a predetermined temperature is supplied to the coolant chamber 31 for circulation therethrough from a chiller unit, not shown, through a pipe 32 for coolant, and the processing temperature of the wafer W on the upper surface of the susceptor 12 is controlled by the temperature of the coolant.

Further, a plurality of heat transfer gas supply holes 33 are formed in a part (hereinafter referred to as the "holding surface") of the upper surface of the susceptor 12 where the wafer W is held by attraction. The heat transfer gas supply holes 33 are connected to a heat transfer gas supply unit, not shown, via a heat transfer gas supply line 34 disposed in the susceptor 12, and the heat transfer gas supply unit supplies helium (He) gas as a heat transfer gas via the heat transfer gas supply holes 33 into a gap between the holding surface and the rear surface of the wafer W.

Further, a plurality of pusher pins 35 are disposed on the holding surface of the susceptor 12, as lift pins that can protrude from the upper surface of the susceptor 12. The pusher pins 35 are connected to a motor, not shown, via respective ball screws, not shown, and are moved vertically, as viewed in FIG. 1, by linear movement of the ball screws into which the rotational movement of the motor is converted, for protrusion from the holding surface as desired. When the wafer W is held on the holding surface by attraction so as to be subjected to plasma processing, the pusher pins 35 are withdrawn inside the susceptor 12. When the wafer W is conveyed from the substrate accommodating chamber 11 subjected to the plasma processing, the pusher pins 35 are moved to protrude from the upper surface of the susceptor 12 to move the wafer W away from the susceptor 12 and lift the wafer W upward.

A gas-introducing showerhead 36 is disposed in a ceiling of the substrate accommodating chamber 11 in a manner opposed to the susceptor 12. The gas-introducing showerhead 36 is comprised of an electrode plate support 38 formed of an insulating material and having a buffer chamber 37 formed therein, and an upper electrode plate 39 (exposed member) supported by the electrode plate support 38 in a manner hanging therefrom. The upper electrode plate 39 is a disk-shaped member formed of silicon, and has a lower surface thereof exposed to the processing space S. The periphery of the upper electrode plate 39 is covered by an annular shield ring 40 formed of an insulating material. In other words, the upper electrode plate 39 is electrically insulated from the wall of the substrate accommodating chamber 11, at a ground potential, by the electrode plate support 38 and the shield ring 40. Further, the substrate processing apparatus 10 has a high-frequency power supply 21b connected to the upper electrode plate 39 via a matcher 22b. Therefore, the upper electrode plate 39 applies high-frequency power to the processing space S.

Connected to the buffer chamber 37 of the electrode plate support 38 is a process gas-introducing pipe 42 extending from a process gas supply unit, not shown. The gas-introducing showerhead 36 is formed with a plurality of gas holes 43 for communication between the buffer chamber 37 and the processing space S. The gas-introducing showerhead 36 supplies a process gas supplied to the buffer chamber 37 through the process gas-introducing pipe 42 to the processing space S through the gas holes 43.

Further, the side wall of the substrate accommodating chamber 11 is formed with an inlet/outlet port 44 for the conveying wafer W in and out, at a location corresponding to a level to which the wafer W is lifted from the susceptor 12 by the pusher pins 35. A gate valve 45 is mounted at the inlet/outlet port 44, for opening and closing the same.

In the substrate accommodating chamber 11 of the substrate processing apparatus 10, the conductive part 29 of the susceptor 12 and the upper electrode plate 39 of the gas-introducing showerhead 36 apply high-frequency power to the processing space S as described hereinabove, whereby the process gas supplied from the gas-introducing showerhead 36 is turned into high-density plasma to generate positive ions and radicals, to perform plasma processing on the wafer W by the positive ions and radicals.

Figure 2:
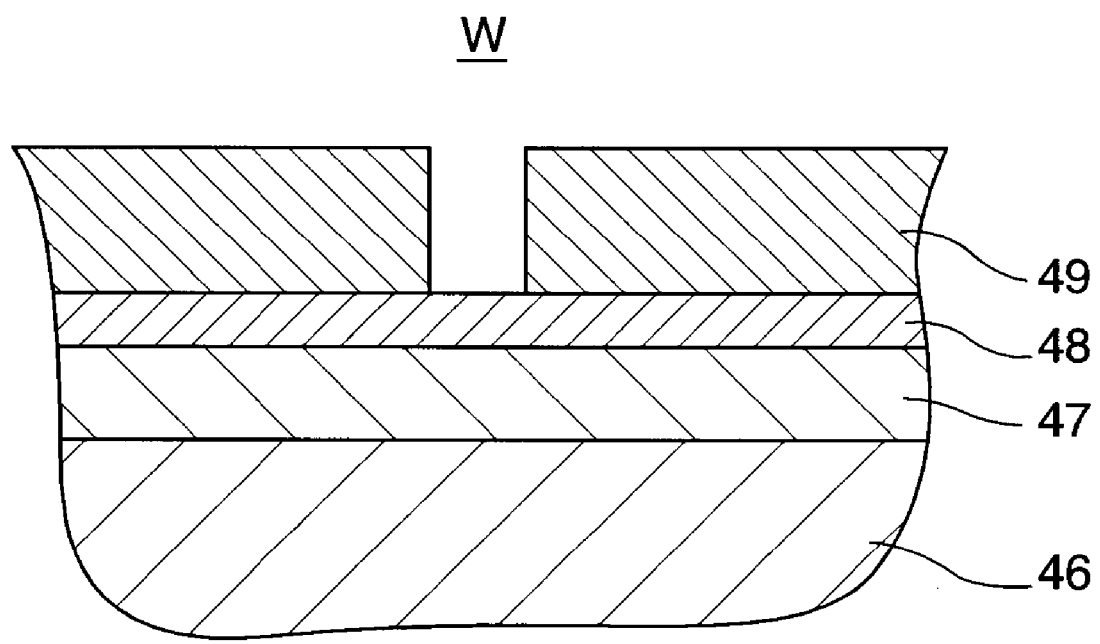
FIG. 2 is a schematic cross-sectional view of the structure of a semiconductor wafer to be subjected to plasma processing by the substrate processing apparatus shown in FIG. 1.

FIG. 2 is a schematic cross-sectional view of the structure of a semiconductor wafer to be subjected to plasma processing by the substrate processing apparatus shown in FIG. 1.

As shown in FIG. 2, the wafer W is comprised of a silicon base material 46, an oxide film 47 formed on a surface of the silicon base material 46, an organic antireflection film 48 formed on the oxide film 47, and a resist film 49 formed on the organic antireflection film 48.

The silicon base material 46 is a disk-shaped thin plate formed of silicon, and the oxide film 47 is formed on the surface of the silicon base material 46 by thermal oxidation. The oxide film 47 is formed of $SiO_2$, and functions as an insulating film. The organic antireflection film 48 is formed of a high molecular resin containing pigments which absorb light having a predetermined wavelength, such as ArF excimer laser light emitted toward the resist film 49. The organic antireflection film 48 prevents the ArF excimer laser light having passed through the resist film 49 from being reflected by the oxide film 47 and then reaching the resist film 49 again. The resist film 49 is formed of a positive photosensitive resin, and when irradiated with an ArF excimer laser beam, it turns alkali soluble.

In the wafer W, the organic antireflection film 48 is formed through coating processing and the like, and then the resist film 49 is formed using a spin coater, not shown. Further, the ArF excimer laser light is irradiated onto the resist film 49 by a stepper, not shown, according to a pattern which is inverted into a predetermined mask pattern, whereby the irradiated portions of the resist film 49 become alkali soluble. Thereafter, a strong alkali developer is dropped onto the resist film 49 to thereby remove the alkali soluble portions. This removes portions corresponding to the pattern to be inverted into the predetermined mask pattern from the resist film 49, so that a resist film 49 exhibiting the predetermined mask pattern, i.e. having the openings at the locations corresponding to the respective via-holes to be formed, for example, remains on the wafer W.

Next, a description will be given of an etching method according to the present embodiment.

FIGS. 3A to 3E are a process diagram illustrating the etching method executed by the substrate processing apparatus shown in FIG. 1.

Figure 3A:
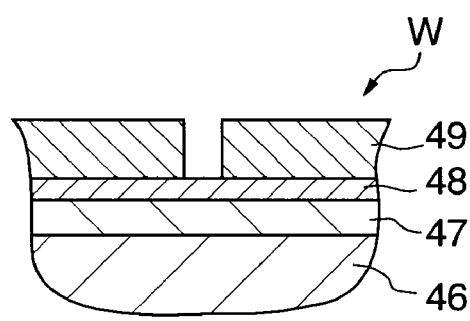
FIGS. 3A to 3E are process diagrams illustrating the etching method executed by the substrate processing apparatus shown in FIG. 1.

As shown in FIGS. 3A to 3E, first, the wafer W on which the resist film 49 exhibiting the predetermined mask pattern is formed is conveyed into the substrate accommodating chamber 11 of the substrate processing apparatus 10 and held by attraction on the upper surface of the susceptor 12 (FIG. 3A).

Figure 3B:
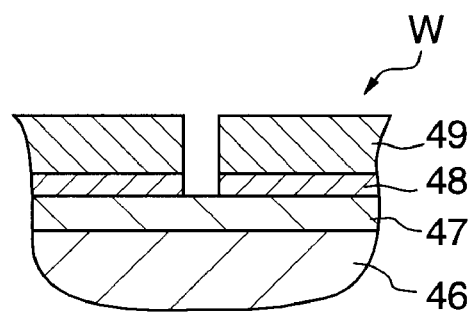

Next, the pressure within the substrate accommodating chamber 11 is set to 6.67 Pa (50 mTorr), and the $CF_4$ gas is supplied from the gas-introducing showerhead 36 to the processing space S at a flow rate of 100 sccm. Then, a high-frequency power of 1000 W is supplied to the upper electrode plate 39 of the gas-introducing showerhead 36 and a high-frequency power of 100 W is supplied to the conductive part 29 of the susceptor 12 at the same time, whereupon the $CF_4$ gas is turned into plasma by the high-frequency power applied to the processing space S to generate positive ions and radicals. These positive ions and radicals collide and react with the portions (corresponding to the openings of the resist film 49) of the organic antireflection film 48 which are not covered with the resist film 49, to thereby etch the portions (an antireflection film etching step). The portions of the organic antireflection film 48 corresponding to the openings of the resist film 49 are etched until the oxide film 47 is exposed. It should be noted that the composition of the organic antireflection film 48 is close to that of the resist film 49, and hence the positive ions and radicals of the plasma generated from the $CF_4$ gas etches the resist film 49 as well (FIG. 3B).

Figure 3C:
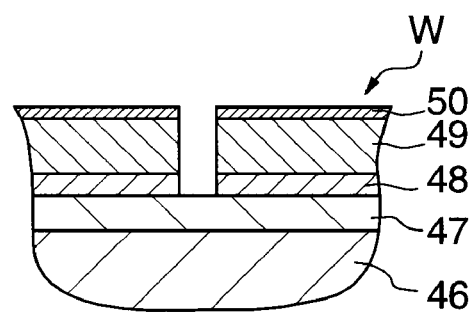

Next, the pressure within the substrate accommodating chamber 11 is set to 1.33 Pa (10 mTorr), and the Ar gas is supplied from the gas-introducing showerhead 36 to the processing space S at a flow rate of 200 sccm. Then, a high-frequency power of 2000 W is supplied to the upper electrode plate 39 and a high-frequency power of 100 W is supplied to the conductive part 29 at the same time, whereupon the Ar gas is turned into plasma to generate positive ions and radicals. Since the upper electrode plate 39 is being supplied with the high-frequency power, the positive ions are efficiently drawn into the upper electrode plate 39, whereby the upper electrode plate 39 is sputtered (a sputtering step). The upper electrode plate 39 is sputtered for 30 seconds. The sputtering of the upper electrode plate 39 results in release of a silicon element, and the released silicon element is deposited on the resist film 49 of the wafer W to form a silicon-containing film 50 (FIG. 3C).

It should be noted that the film thickness of the silicon-containing film 50 is adjusted to such a thickness as enables the same to be removed when the oxide film 47 is etched by an etching process described hereinafter. The adjustment of the film thickness of the silicon-containing film 50 is performed by changing the time period over which the upper electrode plate 39 is sputtered.

The high-frequency power supplied to the upper electrode plate 39 is larger than that applied to the conductive part 29, so that the amount of the positive ions drawn into the upper electrode plate 39 can be positively made larger than that of the positive ions drawn into the susceptor 12. As a consequence, it is possible to cause the upper electrode plate 39 to be sputtered in a larger amount than the susceptor 12 is sputtered.

Figure 3D:
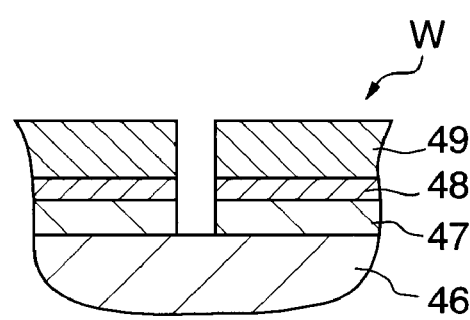
Figure 3E:
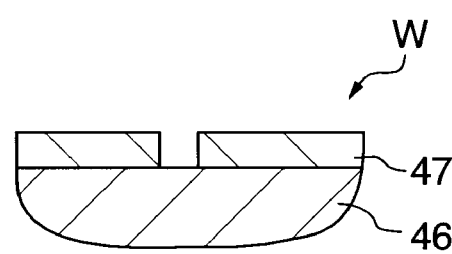

Then, the pressure within the substrate accommodating chamber 11 is set to 2.67 Pa (20 mTorr), and a mixed gas composed of $C_4F_6$ gas, $O_2$ gas and Ar gas is supplied from the gas-introducing showerhead 36 to the processing space S. Then, a high-frequency power of 1600 W is supplied to the upper electrode plate 39 and a high-frequency power of 800 W is supplied to the conductive part 29 at the same time, whereupon the mixed gas is turned into plasma to generate positive ions and radicals. These positive ions and radicals collide and react with the exposed portions of the oxide film 47 to thereby etch the portions (an oxide film etching step). The portions of the oxide film 47 are etched until the silicon base material 46 is exposed. Further, at this time, the silicon-containing film 50 is also etched by the plasma generated from the mixed gas, whereby the resist film 49 is exposed. It should be noted that the silicon-containing film 50 is resistant to the plasma generated from the mixed gas, and hence an etch rate at which the silicon-containing film 50 is etched is low. Therefore, the film thickness of the silicon-containing film 50 may be much smaller than that of the oxide film 47 (FIG. 3D).

Next, the pressure within the substrate accommodating chamber 11 is set to 6.67 Pa, and the $O_2$ gas is supplied from the gas-introducing showerhead 36 to the processing space S at a flow rate of 200 sccm. Then, a high-frequency power of 1000 W is supplied to the upper electrode plate 39 and a high-frequency power of 100 W is supplied to the conductive part 29 at the same time, whereupon the $O_2$ gas is turned into plasma to generate positive ions and radicals. These positive ions and radicals etch the resist film 49 and the remaining organic antireflection film 48. The resist film 49 and the remaining organic antireflection film 48 are etched until the oxide film 47 is exposed (FIG. 3E), followed by terminating the present process.

According to the etching method of the present embodiment, the upper electrode plate 39 formed of silicon is sputtered by the positive ions generated from the Ar gas, and the oxide film 47 is etched by the positive ions and radicals generated from the mixed gas. When the upper electrode plate 39 is sputtered, the silicon element is released, and the released silicon element is deposited on the resist film 49 of the wafer W to form the silicon-containing film 50. The silicon-containing film 50 is resistant to the positive ions and radicals generated from the mixed gas. More specifically, although the silicon-containing film 50 is etched by the plasma generated from the mixed gas, the etch rate at which the silicon-containing film 50 is etched by the plasma is low. This makes it possible to prevent the resist film 49 from being etched during etching of the oxide film 47. In other words, it is possible to easily improve the strength of the resist film 49 by forming the silicon-containing film 50, to thereby easily obtain a desired etching shape of the oxide film 47 when it is etched. Further, since the silicon element is released from the upper electrode plate 39, it is not required to dispose a silicon member or the like other than the upper electrode plate 39 in the substrate accommodating chamber 11, for release of the silicon element, which makes it possible not only to simplify the construction of the substrate processing apparatus 10, but also to dispense with another processing apparatus for forming the silicon-containing film 50.

Further, according to the etching method of the present embodiment, some of the positive ions generated from the Ar gas sputter the exposed portions of the oxide film 47. It is known that when a charged insulating film is sputtered using positive ions generated from Ar gas, electric charge is eliminated from the insulating film. Therefore, the etching method of the present embodiment makes it possible to eliminate electric charge from the oxide film 47. Further, it is known that when an oxide film is sputtered using positive ions generated from Ar gas, the surface of the oxide film becomes hydrophilic. Therefore, the etching method of the present embodiment makes it possible to make the surface of the oxide film 47 hydrophilic, thereby improving intimacy of the oxide film 47 with another film.

According to the etching method of the present embodiment, the portions of the organic antireflection film 48, which are not covered with the resist film 49, are etched prior to sputtering of the upper electrode plate 39. In the etching of the portions, the resist film 49 is also etched, and hence the thickness of the resist film 49 is reduced. However, when the upper electrode plate 39 is sputtered, the silicon-containing film 50 is formed on the resist film 49 having the reduced thickness, whereby it is possible to prevent the resist film 49 from being removed by etching of the oxide film 47.

Further, according to the etching method of the present embodiment, since the high-frequency power is supplied to the upper electrode plate 39, positive ions are efficiently drawn into the upper electrode plate 39, which makes it possible to improve the efficiency of sputtering of the upper electrode plate 39. Furthermore, the high-frequency power supplied to the upper electrode plate 39 is larger than the high-frequency power supplied to the conductive part 29, so that the upper electrode plate 39 can be sputtered in a larger amount than the susceptor 12, which makes it possible to increase the amount of the silicon element released from the upper electrode plate 39. As a consequence, it is possible to quickly and positively form the silicon-containing film 50 on the resist film 49 of the wafer W.

Further, according to the etching method of the present embodiment, since the positive ions generated from the Ar gas are used for sputtering the upper electrode plate 39, it is possible to sputter the upper electrode plate 39 without degrading the resist film 49 or the oxide film 47 of the wafer W.

Furthermore, in the substrate processing apparatus 10, the upper electrode plate 39 to be sputtered is disposed in facing relation to the susceptor 12 on which the wafer W is placed, so that the silicon element released from the upper electrode plate 39 can be positively deposited on the resist film 49 of the wafer W.

In the above-described etching method, when the silicon-containing film 50 cannot be fully removed in the etching of the oxide film 47, it is preferred that the pressure within the substrate accommodating chamber 11 is set to 6.67 Pa, and the $CF_4$ gas is supplied from the gas-introducing showerhead 36 to the processing space S at a flow rate of 100 sccm, whereafter a high-frequency power of 1000 W is supplied to the upper electrode plate 39 and a high-frequency power of 100 W is supplied to the conductive part 29 at the same time. At this time, the $CF_4$ gas is turned into plasma to generate positive ions and radicals. The silicon-containing film 50 can be etched and fully removed by these positive ions and radicals.

Although in the above-described etching method, the high-frequency power of 2000 W is supplied to the upper electrode plate 39 and the high-frequency power of 100 W is supplied to the conductive part 29 for sputtering the upper electrode plate 39, the levels of high-frequency power to be supplied to the upper electrode plate 39 and the conductive part 29 are not limited to these, but a high-frequency power of 1250 W may be supplied to the upper electrode plate 39, and a high-frequency power of 400 W may be supplied to the conductive part 29, for example. However, it is to be understood that in order to increase the amount of the silicon element released from the upper electrode plate 39, the high-frequency power supplied to the upper electrode plate 39 is preferably set to a higher level than that of the high-frequency power supplied to the conductive part 29, and more specifically, it is desirable that the former is set to a level not less than three times as high as that of the latter.

Although in the above-described etching method, the pressure within the substrate accommodating chamber 11 is set to 1.33 Pa for the sputtering of the upper electrode plate 39, this is not limitative. As the pressure is lower, the silicon-containing film 50 grows anisotropically, i.e. in a direction upward from the wafer W. Therefore, it is preferable to set the pressure within the substrate accommodating chamber 11 to a lower level.

Although in the above-described etching method, Ar gas is used for the sputtering of the upper electrode plate 39, the gas used for sputtering the upper electrode plate 39 is not limited to the Ar gas, but a gas, such as an inert or inactive gas other than Ar gas, which cannot degrade the oxide film 47 and the resist film 49 may be used.

Although in the above-described substrate processing apparatus 10, the upper electrode plate 39 is formed of silicon, it is not necessary that the entire upper electrode plate 39 be formed of silicon alone, but it suffices that the portion of the upper electrode plate 39, which faces the processing space S, i.e. the portion to be sputtered contains silicon. Insofar as the portion contains silicon, the silicon element can be released from the upper electrode plate 39 when the upper electrode plate 39 is sputtered.

Further, the substrate to be subjected to plasma processing in the substrate processing apparatus 10 is not limited to wafers for use in semiconductor devices, but substrates for LDCs (Liquid Crystal Display) and FPDs (Flat Panel Display), photomasks, CD substrates, printed circuit boards, and so forth may be processed by the substrate processing apparatus 10.

It is to be understood that the object of the present invention may also be accomplished by supplying a system or an apparatus with a storage medium in which a program code of software, which realizes the functions of the above described embodiment, is stored, and causing a computer (or CPU or MPU) of the system or apparatus to read out and execute the program code stored in the storage medium.

In this case, the program code itself read from the storage medium realizes the functions of the above described embodiment, and therefore the program code and the storage medium in which the program code is stored constitute the present invention.

Examples of the storage medium for supplying the program code include a floppy (registered trademark) disk, a hard disk, a magnetic-optical disk, an optical disk, such as a CD-ROM, a CD-R, a CD-RW, a DVD-ROM, a DVD-RAM, a DVD-RW, and a DVD+RW, a magnetic tape, a nonvolatile memory card, and a ROM. Alternatively, the program may be downloaded via a network.

Further, it is to be understood that the functions of the above described embodiment may be accomplished not only by executing the program code read out by a computer, but also by causing an OS (operating system) or the like which operates on the computer to perform a part or all of the actual operations based on instructions of the program code.

Further, it is to be understood that the functions of the above described embodiment may be accomplished by writing a program code read out from the storage medium into a memory provided on an expansion board inserted into a computer or a memory provided in an expansion unit connected to the computer and then causing a CPU or the like provided in the expansion board or the expansion unit to perform a part or all of the actual operations based on instructions of the program code.

Next, Examples of the present invention will be described in detail.

EXAMPLE 1

First, the wafer W shown in FIG. 2 was prepared. Then, the wafer W was conveyed into the substrate accommodating chamber 11 of the substrate processing apparatus 10, whereafter the portions of the organic antireflection film 48, which were not covered with the resist film 49, were etched by positive ions and radicals generated from the $CF_4$ gas. Further, the pressure within the substrate accommodating chamber 11 was set to 1.33 Pa, and the Ar gas was supplied to the processing space S at a flow rate of 200 sccm. At the same time, a high-frequency power of 2000 W was supplied to the upper electrode plate 39 and a high-frequency power of 100 W was supplied to the conductive part 29, whereby the upper electrode plate 39 was sputtered by positive ions generated from the Ar gas. At this time, when the wafer W was observed, it was confirmed that the silicon-containing film 50 was formed on the resist film 49.

Then, the exposed portions of the oxide film 47 were etched by positive ions and radicals generated from the mixed gas composed of $C_4F_6$ gas, Ar gas, and $O_2$ gas. At this time, when the wafer W was observed, it was confirmed that the silicon-containing film 50 was partially lost around the openings of the resist film 49, but the shape of each opening of the resist film 49 was not deformed.

Next, the remaining silicon-containing film 50 was etched by positive ions and radicals generated from the $CF_4$ gas and fully removed, and then the resist film 49 and the organic antireflection film 48 were etched by positive ions and radicals generated from the $O_2$ gas. Thereafter, when the shape of each via-hole formed in the oxide film 47 was observed, it was confirmed that the via-holes were circular in horizontal cross section, and each via-hole had a diameter of a desired value.

EXAMPLE 2

First, the wafer W shown in FIG. 2 was prepared. Then, the portions of the organic antireflection film 48, which were not covered with the resist film 49, were etched just as in Example 1. Further, the pressure within the substrate accommodating chamber 11 was set to 1.33 Pa, and the Ar gas was supplied to the processing space S at a flow rate of 200 sccm. At the same time, a high-frequency power of 1250 W was supplied to the upper electrode plate 39 and a high-frequency power of 400 W was supplied to the conductive part 29, whereby the upper electrode plate 39 was sputtered by positive ions generated from the Ar gas. At this time, when the wafer W was observed, it was confirmed that the silicon-containing film 50 was formed on the resist film 49. However, the film thickness of the silicon-containing film 50 in Example 2 was smaller than that of the silicon-containing film 50 in Example 1.

Then, the exposed portions of the oxide film 47 were etched just as in Example 1. At this time, when the wafer W was observed, it was confirmed that the silicon-containing film 50 was almost all lost, but the shape of each opening of the resist film 49 was hardly deformed.

Next, the resist film 49 and the organic antireflection film 48 were etched just as in Example 1. Thereafter, when the shape of each via-hole formed in the oxide film 47 was observed, it was confirmed that the via-holes were circular in horizontal cross section, and each via-hole had a diameter of the desired value.

COMPARATIVE EXAMPLE 1

First, the wafer W shown in FIG. 2 was prepared. Then, the portions of the organic antireflection film 48, which were not covered with the resist film 49, were etched just as in Example 1. Further, without sputtering the upper electrode plate 39, the exposed portions of the oxide film 47 were etched similarly to Example 1. At this time, when the wafer W was observed, it was confirmed that the shape of each opening of the resist film 49 was deformed.

Next, the resist film 49 and the organic antireflection film 48 were etched just as in Example 1. Thereafter, when the shape of each via-hole formed in the oxide film 47 was observed, it was confirmed that the via-holes were not circular in horizontal cross section, and each via-hole had a diameter of a larger value than the desired value.

From the above described examples, it was found that if the silicon-containing film 50 is formed on the resist film 49 by sputtering the upper electrode plate 39 formed of silicon, it is possible to prevent the shape of the openings of the resist film 49 from being deformed when the oxide film 47 is etched by positive ions and radicals generated from the mixed gas composed of $C_4F_6$ gas, Ar gas, and $O_2$ gas, to thereby obtain a desired etching shape in the oxide film 47.

What is claimed is:

1. An etching method which is executed by a substrate processing apparatus that includes an accommodating chamber for accommodating a substrate including an oxide film and a resist film formed on the oxide film, and an exposed member disposed in the accommodating chamber and exposed to a space in the accommodating chamber, and performs plasma processing on the substrate by plasma generated in the accommodating chamber, at least part of the exposed member being formed of a silicon-containing material, the etching method comprising:
a sputtering step of sputtering the exposed member by plasma to form a silicon-containing film on the resist film; and
an oxide film etching step of etching the oxide film by plasma, using the resist film and the silicon-containing film as etching masks.

2. An etching method as claimed in claim 1, wherein the substrate has an antireflection film formed between the oxide film and the resist film, and
the etching method comprising an antireflection film etching step of etching the antireflection film prior to said sputtering step.

3. An etching method as claimed in claim 1, wherein a high-frequency power is supplied to the exposed member.

4. An etching method as claimed in claim 1, wherein in said sputtering step, plasma generated from an inert gas or an inactive gas is used.

5. An etching method as claimed in claim 1, wherein the substrate processing apparatus includes a mounting stage disposed in the accommodating chamber, for having the substrate placed thereon, and the exposed member is an electrode plate disposed in facing relation to the mounting stage.

6. An etching method as claimed in claim 5, wherein a high-frequency power is supplied to the mounting stage, and the high-frequency power supplied to the electrode plate is larger than the high-frequency power supplied to the mounting stage.

7. An etching method as claimed in claim 1, wherein the silicon-containing film sandwiches the resist film between the silicon-containing film and an antireflection film.

8. An etching method as claimed in claim 7, wherein the silicon-containing film is removed from the resist film during the step of etching the oxide film.

9. A computer-readable storage medium storing a program for implementing an etching method which is executed by a substrate processing apparatus that includes an accommodating chamber for accommodating a substrate including an oxide film and a resist film formed on the oxide film, and an exposed member disposed in the accommodating chamber and exposed to a space in the accommodating chamber, and performs plasma processing on the substrate by plasma generated in the accommodating chamber, at least part of the exposed member being formed of a silicon-containing material, the etching method comprising:
a sputtering step of sputtering the exposed member by plasma to form a silicon-containing film on the resist film; and
an oxide film etching step of etching the oxide film by plasma, using the resist film and the silicon-containing film as etching masks.

10. The computer readable medium as claimed in claim 9, wherein the silicon-containing film sandwiches the resist film between the silicon-containing film and an antireflection film.

11. The computer readable medium as claimed in claim 10, wherein the silicon-containing film is removed from the resist film during the step of etching the oxide film.

* * * * *